United States Patent

Hipp et al.

[11] Patent Number: 5,825,178
[45] Date of Patent: *Oct. 20, 1998

[54] SENSING DEVICE FOR DETERMINING AN ANGULAR POSITION OF A STEERING WHEEL ON A STEERING COLUMN IN A VEHICLE

[75] Inventors: Ulrich Hipp, Sulz; Manfred Abendroth, Marbach, both of Germany

[73] Assignee: Robert Bosch GmbH, Stuttgart, Germany

[*] Notice: The term of this patent shall not extend beyond the expiration date of Pat. No. 5,646,523.

[21] Appl. No.: 668,923

[22] Filed: Jun. 24, 1996

[30] Foreign Application Priority Data

Sep. 21, 1995 [DE] Germany .................. 195 34 995.4

[51] Int. Cl.⁶ .............. G01B 7/30; B62D 15/02; G01D 5/249
[52] U.S. Cl. .................. 324/207.2; 324/207.22; 324/207.25; 341/15
[58] Field of Search .............. 324/207.2, 207.12, 324/207.25, 207.22, 225, 235, 252; 338/32 H; 341/13–15

[56] References Cited

U.S. PATENT DOCUMENTS 4,792,788  12/1988  Kumar ................... 324/207.2
5,646,523  7/1997  Kaiser et al. .............. 324/207.2

FOREIGN PATENT DOCUMENTS

95/00343  1/1995  Germany .

*Primary Examiner*—Walter E. Snow
*Attorney, Agent, or Firm*—Michael J. Striker

[57] ABSTRACT

The sensing device for determination of a steering wheel angle of a steering column of a vehicle includes a first coded disk which is read by a first group of receiving devices to form a fine code signal and which rotates at the same speed as the steering wheel. A second coded disk rotates with a fourth the speed of the first disk and has two or more pole change positions which are detected by a second group of receiving devices to form a gross code signal. Hall elements are used as receiving devices. Magnetically coded disks having a predetermined sequence of alternating North and South pole regions are used as the coded disks. These regions are distributed around the periphery of the disk and have different arc lengths. Hall switching devices are used as receivers which cooperate with the magnetic regions of the coded disks. An accurate angle position signal for the steering wheel is produced by a device for combining the fine and gross code signals produced by the Hall switching devices which includes a microcomputer μC.

4 Claims, 3 Drawing Sheets

SENSING DEVICE FOR DETERMINING AN ANGULAR POSITION OF A STEERING WHEEL ON A STEERING COLUMN IN A VEHICLE

BACKGROUND OF THE INVENTION

The present invention relates to a sensing device for determination of steering wheel angle, for example the steering wheel angle of a motor vehicle.

For certain safety systems in a motor vehicle, especially for the dynamic drive controller, the actual steering wheel position is required for safety reasons immediately after operation of the ignition switch of the vehicle. Steering wheel angle sensing devices are required in this type of motor vehicle, which act as absolute steering wheel angle detectors and allow an indisputable and accurate steering wheel angle determination immediately after turn-on. An example of this type of steering wheel angle sensing device is described in International Patent Application, PCT/DE 95/00343.

This known sensing device for detection of the steering wheel angle of steering wheel in a motor vehicle has a first coded disk, which is read by a first plurality of reading or receiving devices and which rotates with the same speed as the steering wheel. A second coded disk rotates with a fourth of the speed of the first disk and has three coded tracks which are read or detected by a second plurality of reading devices. A so-called fine code signal in a micro-controller is obtained from the output signal of the reader associated with the first coded disk while a second receiver supplies a gross code signal, which repeats itself after an angular rotation of ±720°, also 1440°. An accurate angular position determination can be performed by suitable coupling of the fine and gross code signals.

Coded disks are used in the known sensing means for detection of steering wheel angle, which have recesses or cut-out portions provided in predetermined locations. These cut-out portions or recesses form the actual code structure. Hall barrier devices which each cooperate with a magnet are used as receivers. The Hall barrier devices are located on one side of the coded disk, while the magnets are arranged on the other side. Because of that the coded disk acts a screen and the Hall switch generates output signals which permits determination of whether a recess is found between it and the associated magnets or not.

SUMMARY OF THE INVENTION

It is an object of the present invention to provide a steering wheel angle sensing device for determination of steering wheel angle which is improved in comparison to the above-described prior art device.

According to the invention the sensing device for determination of a steering wheel angle of a steering wheel mounted on a steering column of a vehicle includes means for generating a fine code signal which repeats after a revolution of the steering column comprising a first coded disk provided with a first code structure and a first plurality of receiving devices including means for reading off the first code structure from the coded disk to form the fine code signal; means for generating a gross code signal including a second coded disk provided with a second code structure and a second plurality of receiving devices including means for reading off the second code structure from the coded disk to form the gross code signal; means for rotating the second coded disk geared down at a predetermined gear ratio relative to the first coded disk; and means for combining the fine code signal and the gross code signal to produce an angular position signal characteristic of an angular position of the steering wheel. At least one coded disk is provided with a predetermined magnetic sequence of North and South pole magnetic regions comprising one of the code structures and the receiving devices associated with the at least one magnetically coded disk comprise Hall switching devices located on one side of the at least one magnetically coded disk.

The sensing device for detection of the steering wheel angle according to the invention described above has the advantage that the magnets which cooperate with the Hall switching devices are eliminated. This advantage results because the code structures of the coded disks are provided by differently magnetized regions or sections of the coded disks. The use of this type of coded disk allows a read-out with a Hall switch whose output signal changes according to the presence of a North or a South pole region.

It is particularly advantageous when the magnetic field behavior during a pole change between a North and South pole regions and vice versa is predominantly linear and symmetric so that a precise switching of the Hall switching devices occurs. The influence of the air gap between the coded disk and the receiving devices is substantially less than the influence of the air gap between the receiving devices and the magnets arranged on the other side of the disk in the known sensing device structure. The sensor is thus easy to mount and reliable since fewer components are required. Reduced demands are made on the individual components of the sensor and the height of the sensor is reduced in relation to that of the known sensor.

BRIEF DESCRIPTION OF THE DRAWING

The objects, features and advantages of the present invention will now be illustrated in more detail by the following detailed description, reference being made to the accompanying drawing in which.

DESCRIPTION OF THE PREFERRED EMBODIMENTS

The steering wheel angle sensing device described in the following is a further development of the steering wheel angle sensor described in PCT/DE 95/00343. Like this known sensor it has a fine system for determination of the steering wheel angle within a steering wheel revolution and a gross system for determination of additional or further steering wheel rotation. The receiving devices are Magnet-Hall barrier devices and/or switching devices. The fine system includes nine Magnet-Hall barrier devices and the gross system includes five Magnet-Hall barrier devices. The arrangement, like the known sensing device, is an absolute angle measuring sensor. The combination of the arrangement of the Magnet-Hall barrier devices together with the rotating coded disks produces, for example, a gray code for the fine system.

The basic structure of the known steering wheel angle sensor, on which the present invention is based, is described in the above-cited reference, International Patent PCT/DE 95/00343. This reference should be considered incorporated by reference herein.

Commercial Magnet-Hall barrier devices are used in the known steering wheel angle sensing device. This known sensing device comprises a magnet M, a Hall element H and a diaphragm B interrupting the magnetic flux. The diaphragm B is formed as a rotating coded disk, in which the code comprises recesses or cutout portions of the disk. The read-out of the code occurs with a predetermined number of Hall barrier devices, which are arranged with uniform angular spacing under each other on the periphery of the disk. For example nine Hall elements and nine individual magnets which are equally spaced from each other with an angular spacing of 40° around the periphery of the disk are necessary for the fine system of the steering wheel angle sensing device.

Figure 1A:
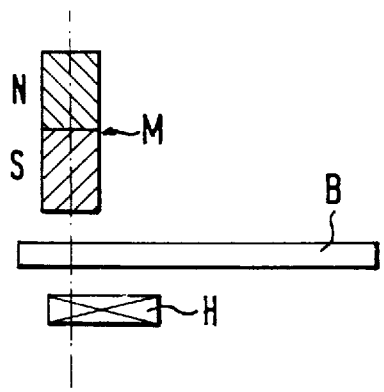
FIGS. 1a and 1b are diagrammatic illustrations of Hall elements and/or Hall switching devices.
Figure 1B:
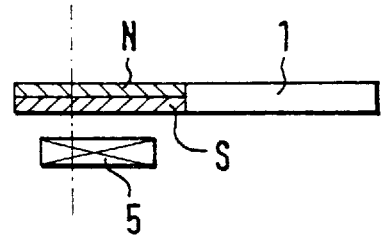

In the steering wheel angle sensing device according to the invention the known arrangement is replaced by a system in which the magnets and the coded disk are combined in one component, since a coded disk 1 in accordance to the embodiment of FIG. 3 is used for the fine system, which carries the required Gray codes in the form of alternating North and South magnetic pole regions. A Hall switching device 5 according to FIG. 1b is still required in this system according to the invention which does not need separate magnet components.

This type of disk can be made of plastic according to a certain process. A specially made magnetic ring of high permeability material which has suitable magnetic pole change sites formed by the alternating North and South pole regions and which is required for the peripheral border region of the piece is inserted for this purpose in an injection mold. A polyamide plastic filled with strontium titanate powder is for example used as a plastic material. During the injection molding process the ferrite material is magnetically formed by the magnetic ring found in the mold so that the arising molded body carries the code of the embedded magnetic ring as a magnetic image. These coded disks are, for example, made by the Magnet-Physik Dr. Steingroever GmbH Company.

In order to obtain the desired Gray code, the magnetic code pattern, if necessary must still be corrected, since weak field distortions arise because of the differing widths of the coded segments (sequentially alternating North-South magnetic pole regions), which influence the magnetic pole change locations, also the zero passage of the magnetic field. The correction occurs by a geometric adjustment of the magnetic pole change, which compensates for the present field (zero passage distortions) distortions.

Besides this disk a Hall switching device, which should be located at a minimum distance from the disk, is still required to produce the Gray code. The structure of the steering wheel angle sensor of the invention which results is superior in many ways to that of the current steering wheel angle sensor for both the fine and gross system. The number of individual components is reduced; the attachments and manipulations of many individual magnets are eliminated. Also the operational reliability is improved. As required by the structure of the sensing device, the Hall switching devices for the gross and fine system can be arranged on one side of the conductor plate so that the height of the sensing device can be reduced and the manufacturing cost of the conductor plate can be minimized by the one-sided attachment.

Figure 3A:
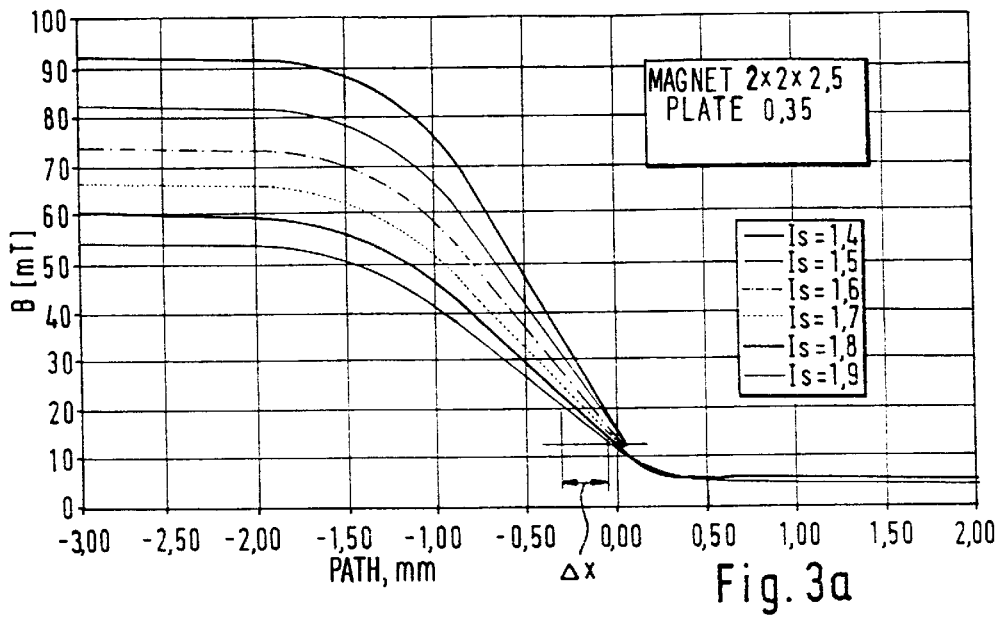
FIG. 3a and 3b are graphical illustrations showing the dependence of magnetic field strength during a magnetic polarity change on angular position and the effect of air gap tolerances.
Figure 3B:
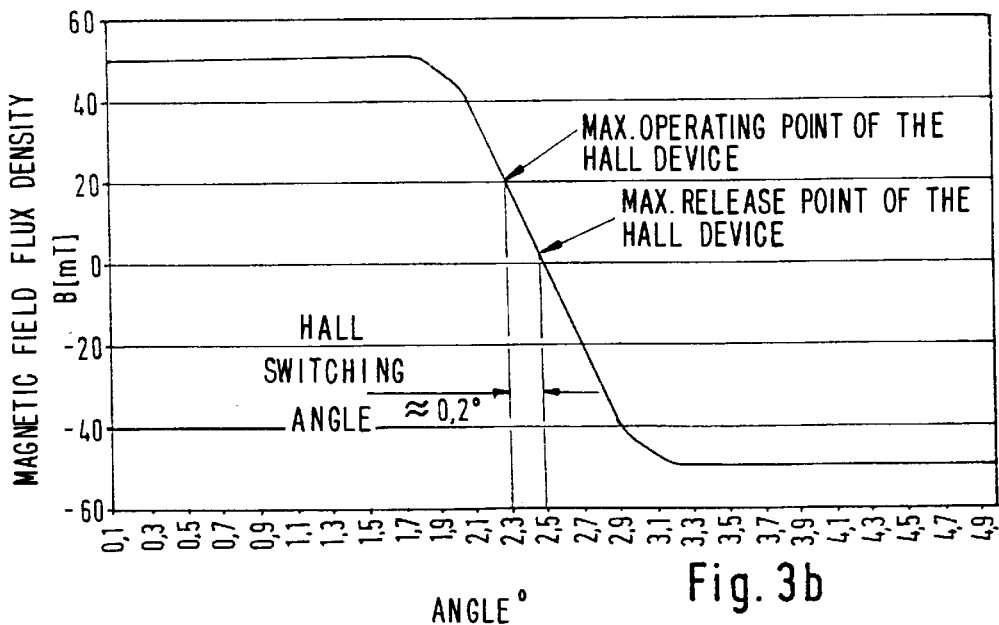

A very small pole change or field reversal angle, which amounts to less than 1°, is possible by the use of a magnetic coded disk in which the code is provided by the alternating North-South magnetic pole regions. The angular resolution of this type of sensor is substantially determined only by the positional accuracy of the Hall switching device on the conductor plate and the accuracy with which the pole change is formed in the plastic disk material. The difference between the magnetic properties of a sensing device according to the system proposed here and the current sensing arrangement is illustrated in FIGS. 3a and 3b. The influence of air gap tolerance over the path (FIG. 3a) and the magnetic flux density variation with angle during a magnetic pole change is shown in both of these figures. A rotation angle of about 0.7° is required for the switching of the Hall switching device with an air gap of 1 mm for an assumed code disk diameter of 50 mm. The necessary switching angle is strongly dependent on the size of the air gap, so that the permissible values of the air gap must be kept within narrow limits for this reason. In contrast to the behavior which the known sensing devices shows, the behavior of the system described here using the magnetically coded disk is substantially improved as shown in FIG. 3b. A magnetic pole reversal is detected here in a very narrow angular range of less than 1°. Here however the sign of the flux density changes in contrast to the Hall barrier arrangement so that the selection of an operating and release point for the Hall switching device can be made without a problem. A switching device can be selected whose release point is in the vicinity of 0 mT. Since the sign of the flux density always changes in a pole change, a reliable switching is also always guaranteed. The spacing of the Hall switching device in the vicinity of the usual tolerances is clearly less than for the Hall barrier arrangement. It must only be guaranteed that the operating point, which is typically about 20 mT, is always reached. Measured flux density in a spacing of 0.7 mm amounts to about 50 mT, in as much as plastoferrite is used as the disk. In a typical arrangement a switching path of about 0.2° is achieved.

Figure 2:
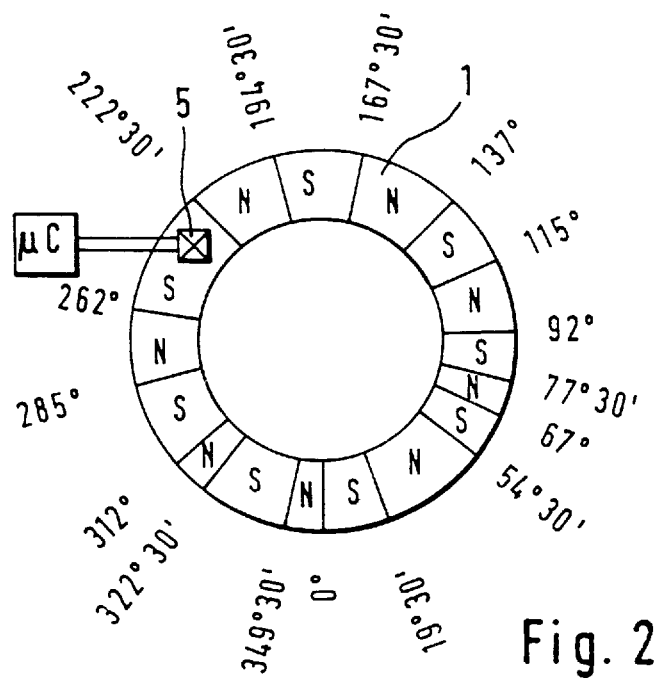
FIG. 2 is a diagrammatic plan view of a coded disk.
Figure 4:
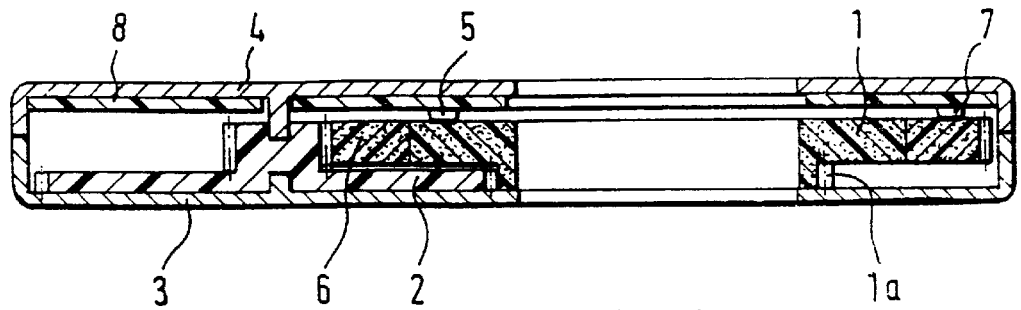
FIG. 4 is a cross-sectional view through one embodiment of a sensing device according to the invention.

The coded disk of the fine system is shown in FIG. 2. This disk has alternating North and South pole regions N,S, whose extent and/or arc length differs. The transition regions between the magnetic poles are indicated by the associated angular degrees in FIG. 2. This coded disk is combined with the unillustrated steering column of the motor vehicle and rotates with it synchronously. The so-called fine coded disk 1 cooperates with the Hall switching device 5, of which only one is illustrated. The output signals of the Hall switching device 5 are evaluated with the help of a microcomputer $\mu C$. The cooperation between the coded disk 1 and the Hall switch 5 is shown in FIG. 4. FIG. 4 shows the mechanical structure of the steering wheel angle sensing device according to the invention including the fine and gross system.

The fine coded disk again indicated with a 1 is shown in FIG. 4, which is made of plastoferrite and is provided with alternating magnetic pole regions or segments so that a special Gray code results in connection with the nine Hall switching devices 5. The fine coded disk 1 is provided with gear teeth 1a besides the magnetic code structure. The steering column of the vehicle passes through the sensing device. It is connected fixidly with the inner diameter of the coded disk 1 by an unshown attaching device so that it rotates without play with the steering shaft. A gear wheel 2 is engaged with the gear teeth of the coded disk 1, which is mounted between a pin of the housing upper portion 3 and a pin of the housing lower portion 4. This gear wheel drives the gross coded disk 6, which is mounted on the outer diameter of the fine coded disk 1.

Figure 5:
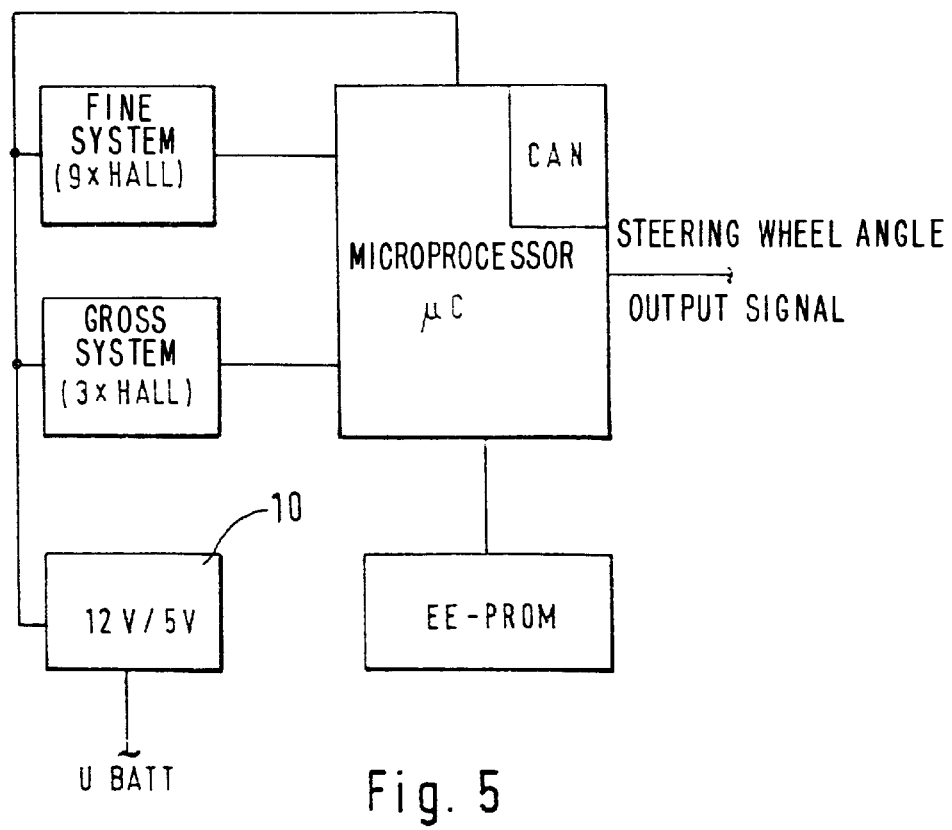
FIG. 5 is a block diagram of the electronic circuitry in the steering wheel sensing device according to the invention.

The gross coded disk 6 likewise is made of plastoferrite like the fine code disk, but contains however only two different magnetic regions in contrast to it. The read-out of the gross coded disk occurs similarly with a Hall switching device 7, which sits with the Hall switching device 5 of the fine code system on a common conductor plate 8. The conductor plate 8 besides the Hall switching devices also carries the structural circuit device required for the analysis. The heart of the circuit device on the carrier 8 is a microprocessor which, as already described in International Patent Application PCT/DE 95/00343, analyzes the fine code signal and/or the corresponding code and generates from that the associated angle value. It is supplied by a digital interface, for example a CAN-interface, to a controlling regulating device which is not shown. The electronics which are part of the steering angle sensing device are shown in the block diagram in FIG. 5. This block diagram shows the microprocessor $\mu C$ connected with the nine Hall switching devices 5 of the fine system and the three (or more) Hall switching devices of the gross system and their output signals. The power supply comprises a battery, which supplies the voltage UBatt, and/or guarantees this voltage by means of the voltage regulator 10. An output signal is read out of the microcomputer $\mu C$ which corresponds to the steering wheel angle. The microprocessor $\mu C$ is also connected with a memory which can be the EE-PROM indicated in FIG. 5.

While the invention has been illustrated and described as embodied in a steering wheel angle sensing device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is desired to be protected by Letters Patent is set forth in the appended claims.

What is claimed is:

1. A sensing device for determination of an angular position of a steering wheel on a steering column in a vehicle, said sensing device comprising means for generating a fine code signal, said fine code signal repeating after a revolution of the steering column, said means for generating a fine code signal including a first coded disk provided with a first code structure, a first plurality of receiving devices and means for reading off said first code structure from the first coded disk to form said fine code signal, wherein said first plurality of receiving devices consists of nine of said receiving devices spaced 40° from each other around an outer periphery of the first coded disk and the first code structure on the first coded disk defines a Gray code;

means for generating a gross code signal including a second coded disk provided with a second code structure and a second plurality of receiving devices including means for reading off said second code structure from the second coded disk to form said gross code signal;

means for rotating the second coded disk geared down at a predetermined gear ratio relative to the first coded disk; and means for combining the fine code signal and the gross code signal to generate an angular position signal characteristic of an angular position of the steering wheel;

wherein at least one of said first and second coded disks is a magnetically coded disk provided with a predetermined sequence of alternating North and South pole magnetic regions to provide said code structure and said receiving devices associated with the magnetically coded disk comprise Hall switching devices located on one side of said magnetically coded disk and wherein the first plurality of receiving devices and the second plurality of receiving devices are arranged in a single plane.

2. The sensing device as defined in claim 1, wherein said alternating North and South pole magnetic regions are provided along an outer circumference of said magnetically coded disk and respective arc lengths of the North and South pole magnetic regions are different from each other.

3. The sensing device as defined in claim 1, wherein the second plurality of receiving devices comprises at least three of said receiving devices and the second code structure of the second coded disk comprises a 3-bit code for the gross code signal.

4. The sensing device as defined in claim 1, wherein the means for combining the fine code signal and the gross code signal to generate the angular position signal comprises a microprocessor ($\mu C$) at least one EE-PROM memory connected to the microprocessor ($\mu C$) and a CAN-bus interface for supplying the angular position signal to a controlling regulating device.

* * * * *